United States Patent
Kurachi (10) Patent No.: US 9,018,679 B2
(45) Date of Patent: Apr. 28, 2015

(54) SEMICONDUCTOR DEVICE

(71) Applicant: Sumitomo Electronic Device Innovations, Inc., Yokohama-shi, Kanagawa (JP)

(72) Inventor: Yasuyo Kurachi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/853,748

(22) Filed: Mar. 29, 2013

(65) Prior Publication Data

US 2013/0256752 A1    Oct. 3, 2013

(30) Foreign Application Priority Data

Mar. 30, 2012  (JP) ................... 2012-080586

(51) Int. Cl.
*H01L 29/66* (2006.01)
*H01L 29/78* (2006.01)
*H01L 29/778* (2006.01)
*H01L 29/45* (2006.01)
*H01L 29/205* (2006.01)

(52) U.S. Cl.
CPC ............. *H01L 29/78* (2013.01); *H01L 29/452* (2013.01); *H01L 29/66462* (2013.01); *H01L 29/7785* (2013.01); *H01L 29/205* (2013.01)

(58) Field of Classification Search
CPC ..................................................... H01L 29/00
USPC .................................................. 257/191, 192
See application file for complete search history.

(56) References Cited

U.S. PATENT DOCUMENTS

| | | | | |
|---|---|---|---|---|
| 6,399,430 | B1 * | 6/2002 | Morikawa | 438/167 |
| 2002/0074563 | A1 * | 6/2002 | Bito et al. | 257/192 |
| 2004/0266090 | A1 * | 12/2004 | Nakamura | 438/217 |
| 2009/0078966 | A1 * | 3/2009 | Asai et al. | 257/194 |
| 2010/0001318 | A1 * | 1/2010 | Bito | 257/192 |
| 2010/0140672 | A1 * | 6/2010 | Aoike et al. | 257/280 |
| 2011/0169053 | A1 * | 7/2011 | Yoshinaga | 257/192 |
| 2012/0025271 | A1 * | 2/2012 | Nakano | 257/194 |
| 2012/0068772 | A1 * | 3/2012 | Murad et al. | 330/296 |
| 2012/0126288 | A1 * | 5/2012 | Bito | 257/192 |
| 2013/0321087 | A1 * | 12/2013 | Lender et al. | 330/296 |

FOREIGN PATENT DOCUMENTS

JP    5-211177 A    8/1993

* cited by examiner

*Primary Examiner* — Telly Green
(74) *Attorney, Agent, or Firm* — Westerman, Hattori, Daniels & Adrian, LLP (57) ABSTRACT

A semiconductor device includes: an operation layer that is provided on a substrate and is made of a GaAs-based semiconductor; a first AlGaAs layer provided on the operation layer; a gate electrode provided on the first AlGaAs layer; an second AlGaAs layer having n-type conductivity and provided on the first AlGaAs layer of both sides of the gate electrode, an Al composition ratio of the second AlGaAs layer being larger than that of the first AlGaAs layer and being equal to or more than 0.3 and equal to or less than 0.5; an n-type GaAs layer selectively provided on the second AlGaAs layer; and a source electrode and a drain electrode that contain Au and are provided on the n-type GaAs layer.

6 Claims, 6 Drawing Sheets

SEMICONDUCTOR DEVICE

CROSS-REFERENCE TO RELATED APPLICATION

This application is based upon and claims the benefit of priority of the prior Japanese Patent Application No. 2012-080586, filed on Mar. 30, 2012, the entire contents of which are incorporated herein by reference.

BACKGROUND (i) Technical Field

A certain aspect of the embodiments discussed herein is related to a semiconductor device, and more particularly, to a semiconductor device which has an ohmic electrode containing Au.

(ii) Related Art

A semiconductor device, such as a FET (Field Effect Transistor) using a GaAs-based semiconductor, is used as a high frequency element. An electrode containing Au is used as a source electrode and a drain electrode of such a FET. Japanese Patent Application Publication No. 5-211177 discloses the FET using the GaAs-based semiconductor.

However, when an element contained in the source electrode and the drain electrode diffuses into the GaAs-based semiconductor layer, an abnormality in an electrical characteristic may occur.

SUMMARY

It is an object of the present invention to provide a semiconductor device that can restrain diffusion of an element contained in a source electrode and a drain electrode into a semiconductor layer.

According to an aspect of the present invention, there is provided a semiconductor device including: an operation layer that is provided on a substrate and is made of a GaAs-based semiconductor; a first AlGaAs layer provided on the operation layer; a gate electrode provided on the first AlGaAs layer; an second AlGaAs layer having n-type conductivity and provided on the first AlGaAs layer of both sides of the gate electrode, an Al composition ratio of the second AlGaAs layer being larger than that of the first AlGaAs layer and being equal to or more than 0.3 and equal to or less than 0.5; an n-type GaAs layer selectively provided on the second AlGaAs layer; and a source electrode and a drain electrode that contain Au and are provided on the n-type GaAs layer.

DETAILED DESCRIPTION

Hereinafter, a description will be given of embodiments of the invention, with reference to drawings.

First Embodiment

Figure 1:
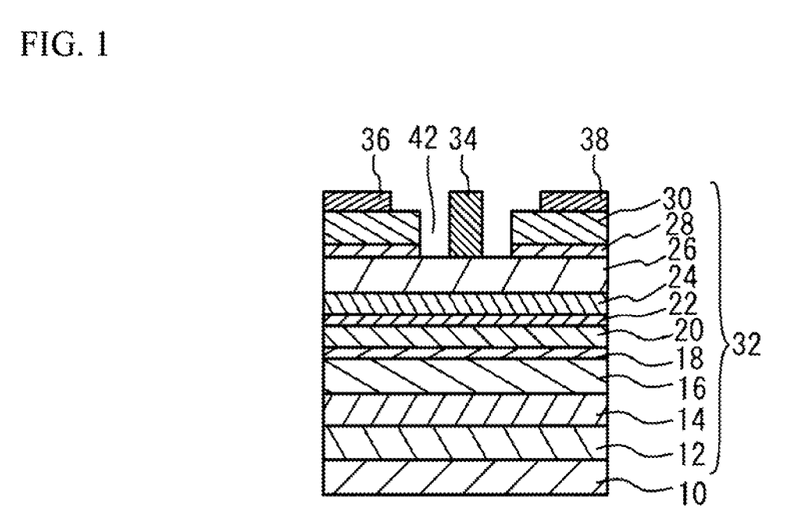
FIG. 1 is a cross-sectional diagram of a semiconductor device according to a first embodiment.

A description will be given of a first embodiment in contrast with a comparative example. FIG. 1 is a cross-sectional diagram of a semiconductor device according to the first embodiment. In the first embodiment, a semiconductor layer 32 is provided on a GaAs substrate 10, as illustrated in FIG. 1. The semiconductor layer 32 is made of an undoped GaAs layer 12, an undoped AlGaAs layer 14, an n-type AlGaAs layer 16, an undoped AlGaAs layer 18, an undoped InGaAs layer 20, an undoped AlGaAs layer 22, an n-type AlGaAs layer 24, an undoped AlGaAs layer 26, an n-type AlGaAs layer 28, and an n-type GaAs layer 30 stacked from a side of the substrate 10. A recess 42 is formed in the n-type AlGaAs layer 28 and the n-type GaAs layer 30. On the undoped AlGaAs layer 26 in the recess 42, a gate electrode 34 is formed. On the n-type GaAs layer 30 sandwiching the gate electrode 34, a source electrode 36 and a drain electrode 38 are formed.

The undoped GaAs layer 12 and the undoped AlGaAs layer 14 serve as buffer layers. Each of the n-type AlGaAs layer 16 and the n-type AlGaAs layer 24 serves as an electron supply layer which supplies an electron to a channel layer. The undoped InGaAs layer 20 serves as the channel layer. Each of the undoped AlGaAs layer 18 and the undoped AlGaAs layer 22 serves as a spacer layer between the electron supply layer and the channel layer. The undoped AlGaAs layer 26 serves as a schottky layer that forms schottky junction between the gate electrode 34 and the semiconductor layer 32. The n-type AlGaAs layer 28 serves as a diffusion restraining layer that restrains diffusing Au into the semiconductor layer 32. The n-type GaAs layer 30 serves as a contact layer that forms ohmic contacts between the semiconductor layer 32 and the source electrode 36 and between the semiconductor layer 32 and the drain electrode 38

Figure 2:
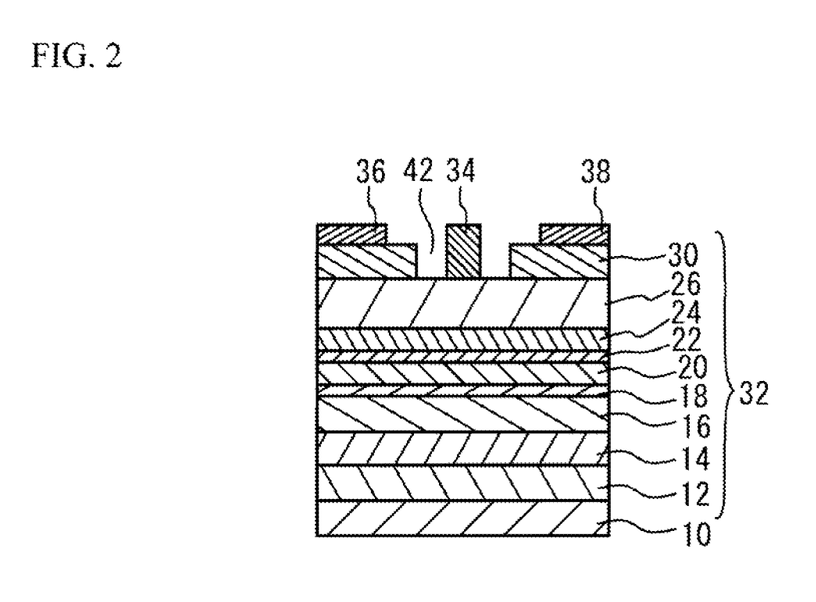
FIG. 2 is a cross-sectional diagram of a semiconductor device according to a comparative example.

FIG. 2 is a cross-sectional diagram of a semiconductor device according to a comparative example. In the comparative example, the n-type AlGaAs layer 28 is not formed, as illustrated in FIG. 2. Since other compositions are the same as those in FIG. 1 of the first embodiment, a description thereof is omitted.

The source electrode 36 and the drain electrode 38 are made of an AuGe film, a Ni film, and an Au film stacked from the semiconductor layer 32, and are formed by performing a heat treatment. The AuGe film, the Ni film, and the Au film form an alloy layer in the n-type GaAs layer 30, so that the ohmic contacts are formed between the semiconductor layer 32 and the source electrode 36 and between the semiconductor layer 32 and the drain electrode 38. In the formation of the alloy layer, Au in the AuGe film melted by the heat treatment combines with Ga. Remaining As in the n-type GaAs layer 30 combines with Ni and Ge. Thereby, a Ni—As—Ge alloy domain with a low resistance is formed. Therefore, contact resistances between the source electrode 36 and the n-type GaAs layer 30 and between the drain electrode 38 and the n-type GaAs layer 30 become a low level.

In a high temperature exposure test or a high temperature energization test, an Au—Ga alloy is remelted and Au performs anomalous diffusion into the semiconductor layer 32. The Au—Ga alloy is a high resistance. Therefore, when Au diffuses into the semiconductor layer 32, an Au—Ga alloy domain is expanded and an on-resistance Ron of the FET increases. While the diffusion of Au remains in the n-type GaAs layer 30, the increase of the on-resistance Ron is relatively slow. However, in the comparative example, when the diffusion of Au reaches the undoped AlGaAs layer 26, the contact resistances between the source electrode 36 and the undoped InGaAs layer 20 as a channel layer and between the drain electrode 38 and the undoped InGaAs layer 20 increase rapidly, and the on-resistance Ron of the FET increases rapidly. Thereby, a saturation drain current Idss decreases.

In the first embodiment, in order to restrain the diffusion of Au into the undoped AlGaAs layer 26, the n-type AlGaAs layer 28 is provided between the undoped AlGaAs layer 26 and the n-type GaAs layer 30. The n-type AlGaAs layer 26 (i.e., a second AlGaAs layer) has an Al composition ratio larger than the undoped AlGaAs layer 26 and the n-type AlGaAs layer 24 (i.e., a first AlGaAs layer), and the Al composition ratio is equal to or more than 0.3 and equal to or less than 0.5. Here, the Al composition ratio corresponds to a X value at the time of setting the AlGaAs layer to $Al_xGa_{1-x}As$. When the Al composition ratio of the AlGaAs layer becomes large, a diffusion velocity of Au becomes slow, and time elapsed before the diffusion of Au reaches the undoped AlGaAs layer 26 becomes long. The reason the on-resistance Ron cannot increase easily even when Au is diffused into the n-type AlGaAs layer 28 is that the n-type AlGaAs layer 28 is thin.

It is desirable that the Al composition ratios of the undoped AlGaAs layer 26 and the n-type AlGaAs layer 24 are equal to or more than 0.2 and equal to or less than 0.3. This is because of ensuring sufficient etching selectivity to form the recess 42, and reducing the contact resistances between the source electrode 36 and the undoped InGaAs layer 20 as a channel layer and between the drain electrode 38 and the undoped InGaAs layer 20. The Al composition ratios of the undoped AlGaAs layer 26 and the n-type AlGaAs layer 24 are not limited to the above-mentioned range.

Figure 3A:
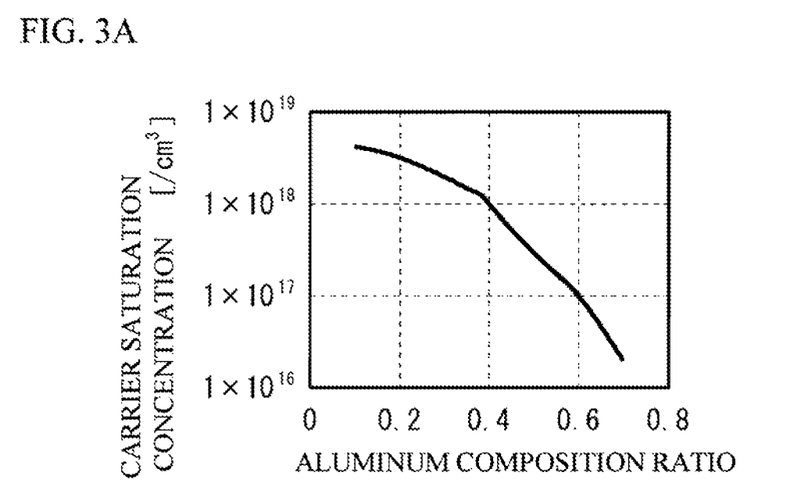
FIG. 3A is a diagram illustrating a carrier saturation concentration relative to an aluminum (Al) composition ratio of AlGaAs.
Figure 3B:
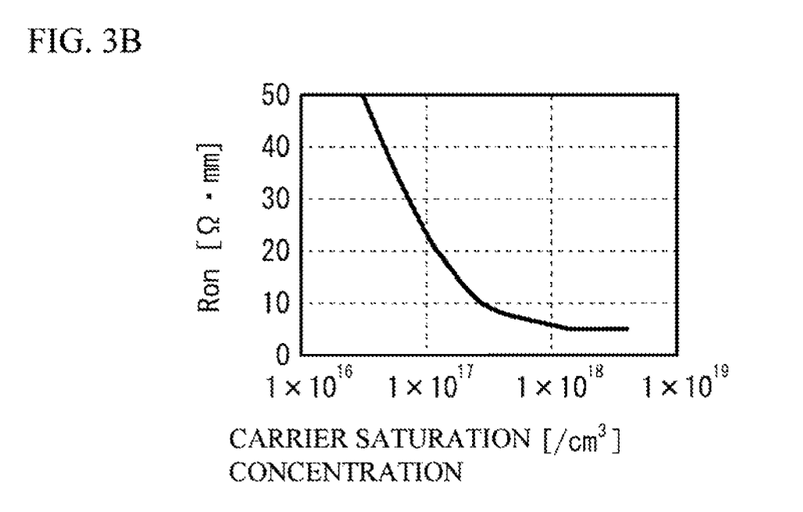
FIG. 3B is a diagram illustrating an on-resistance Ron relative to the carrier saturation concentration.

It is desirable that the Al composition ratio of the n-type AlGaAs layer 28 is equal to or more than 0.3 in order to slow a diffusion velocity of Au. It is more desirable that the Al composition ratio of the n-type AlGaAs layer 28 is equal to or more than 0.35 or 0.4. Moreover, it is desirable that the Al composition ratio of the n-type AlGaAs layer 28 is equal to or less than 0.5. FIG. 3A is a diagram illustrating a carrier saturation concentration relative to the Al composition ratio of AlGaAs, and illustrates a measurement value. Even when the addition of dopant such as Si is increased, a phenomenon in which carrier concentration is saturated by taking in impurities occurs. The carrier saturation concentration indicates a saturated carrier concentration. FIG. 3B is a diagram illustrating the on-resistance Ron relative to the carrier saturation concentration, and illustrates a result of calculation. When the carrier saturation concentration is smaller than $2\times10^{17}$ $cm^{-3}$, the on-resistance increases rapidly. This is because a tunnel current which passes the n-type AlGaAs layer 28 becomes small when the carrier saturation concentration decreases. It is desirable that the Al composition ratio is equal to or less than 0.5 in order to make the carrier saturation concentration larger than $2\times10^{17}$ $cm^{-3}$, as illustrated in FIG. 3A. It is more desirable that the Al composition ratio is equal to or less than 0.48, and it is further more desirable that the Al composition ratio is equal to or less than 0.45. It is more desirable that the film thickness of the n-type AlGaAs layer 28 is equal to or more than 5 nm from a viewpoint of diffusion restraining of Au. It is desirable that the film thickness of the n-type AlGaAs layer 28 is equal to or less than 7.5 nm when the throughput of the process at the time of forming the recess 42 is taken into consideration. It is more desirable that the film thickness of the n-type AlGaAs layer 28 is equal to or more than 5.5 nm and equal to or less than 7.0 nm. It is desirable that a dope amount of the n-type AlGaAs layer 28 is equal to or more than $2\times10^{17}$ $cm^{-3}$, and it is more desirable that the dope amount of the n-type AlGaAs layer 28 is equal to or more than $5\times10^{17}$ $cm^{-3}$. It is desirable that a dope amount of the n-type GaAs layer 30 is equal to or more than $1\times10^{18}$ $cm^{-3}$ in order to restrain the contact resistance, and it is more desirable that the dope amount of the n-type GaAs layer 30 is equal to or more than $2\times10^{18}$ $cm^{-3}$.

The inventor has manufactured a FET in which a Si dope amount of the n-type GaAs layer 30 is $3\times10^{18}$ $cm^{-3}$, the film thickness of the n-type GaAs layer 30 is 80 nm, the Si dope amount of the n-type AlGaAs layer 28 is $1\times10^{18}$ $cm^{-3}$, the film thickness of the n-type AlGaAs layer 28 is 5 nm, the Al composition ratio of the n-type AlGaAs layer 28 is 0.3, and the Al composition ratio of the undoped AlGaAs layer 26 is 0.25. The film thicknesses of the AuGe film, the Ni film, and the Au film for forming the source electrode 36 and the drain electrode 38 are 30 to 40 nm, 5 to 10 nm, and 200 to 500 nm, respectively. After the AuGe film, the Ni film, and the Au film are formed on the n-type GaAs layer 30, the heat treatment, for 3 minutes has been performed on the FET at 450 degrees for alloying. In the comparative example, the n-type AlGaAs layer 28 is not provided, and other compositions are the same as those of the first embodiment. The high temperature energization test has been performed on the manufactured FET. In the high temperature energization test, a channel temperature has been set to 250 degrees, and 0.7×Idss has been applied as a drain current.

Figure 4A:
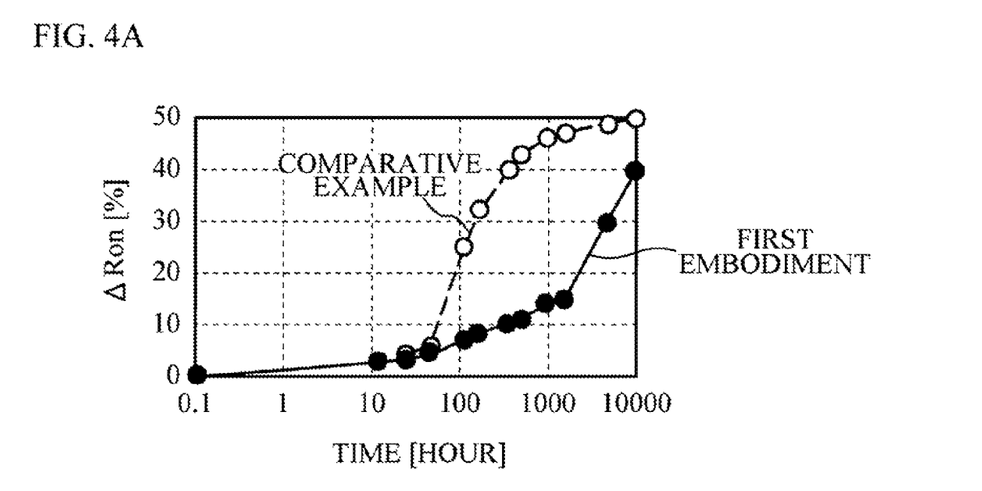
FIG. 4A is a diagram illustrating $\Delta$Ron relative to time of a high temperature energization test.
Figure 4B:
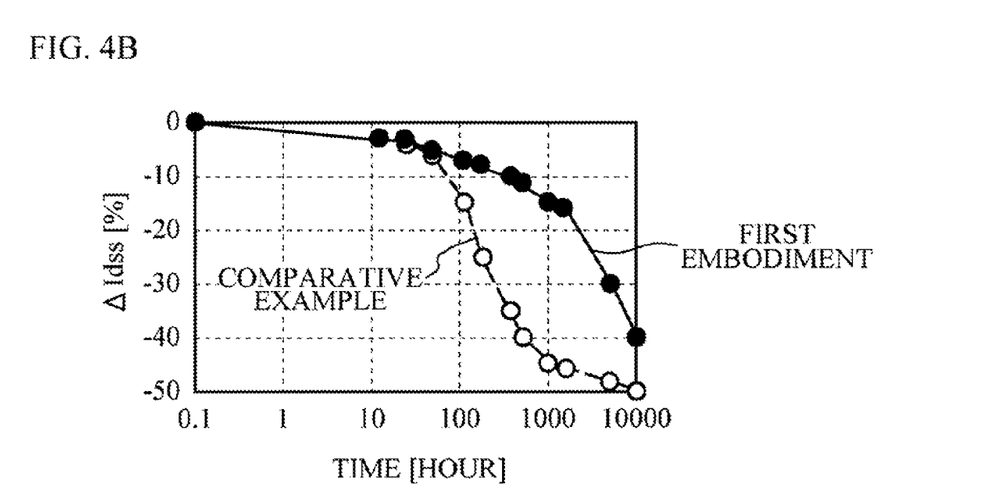
FIG. 4B is a diagram illustrating $\Delta$Idss relative to time of the high temperature energization test.

FIG. 4A is a diagram illustrating ΔRon relative to time of the high temperature energization test, and FIG. 4B is a diagram illustrating ΔIdss relative to time of the high temperature energization test. The ΔRon and the ΔIdss indicate rates of change relative to the Ron and the Idss before the high temperature energization test, respectively. Black dots and white dots illustrate measurement points of the first embodiment and the comparative example, respectively. Each solid line is a straight line connected between the black dots, and each dashed line is a straight line connected between the white dots. In the comparative example, when the time exceeds 100 hours, the ΔRon increases rapidly and the ΔIdss decreases rapidly, as illustrated in FIGS. 4A and 4B. On the contrary, in the first embodiment, until the time exceeds 1000 hours, the change of ΔRon and ΔIdss is loose. Thus, the n-type AlGaAs layer 28 is provided, so that the characteristic change in the high temperature energization test can be restrained. Also in the high temperature exposure test, the same test result is obtained.

Figure 5A:
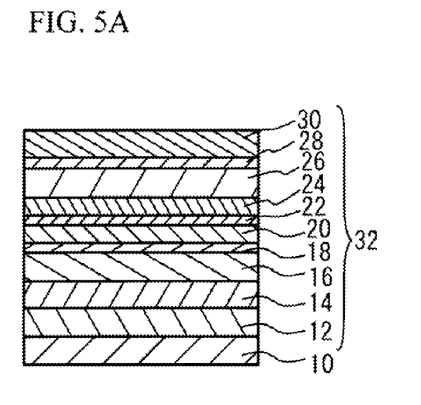
FIGS. 5A to 5D are cross-sectional diagrams illustrating a method for manufacturing the semiconductor device according to the first embodiment.
Figure 5B:
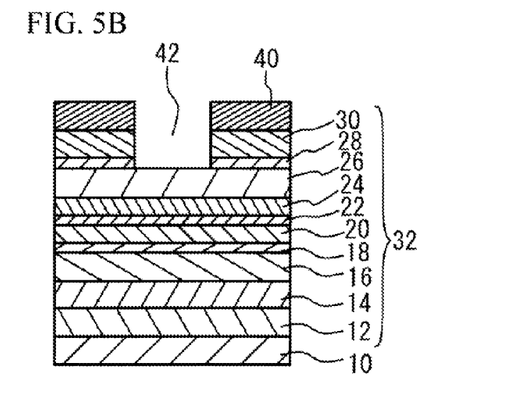

A description will foe given of a method for manufacturing the semiconductor device according to the first embodiment. FIGS. 5A to 5D are cross-sectional diagrams illustrating the method for manufacturing the semiconductor device according to the first embodiment. As illustrated in FIG. 5A, the semiconductor layer 32 is formed an the GaAs substrate 10 with the use of a MOCVD (Metal Organic Chemical Vapor Deposition) method. As illustrated in FIG. 5B, a photoresist 40 is applied on the semiconductor layer 32. An opening is formed in the photoresist 40 by carrying out exposure and development. The photoresist 40 is masked and dry etching of the n-type GaAs layer 30 is performed. In the dry etching, gas containing $SF_6$ and $SiCl_4$ is used. The etching is stopped by the n-type AlGaAs layer 28. As etching gas, chlorine gas containing Cl$_2$, BCl$_3$ or the like can be used. Post-processing of the dry etching is performed using an acid-based drug solution. As the acid-based drug solution, dilute hydrochloric acid or dilute nitric acid is used, for example. Then, the semiconductor device is washed. The n-type AlGaAs layer 28 is damaged by the dry etching. Therefore, when the film thickness of the n-type AlGaAs layer 28 is equal to or less than 7.5 nm, the n-type AlGaAs layer 28 is removable by a process using the acid-based drug solution.

Figure 5C:
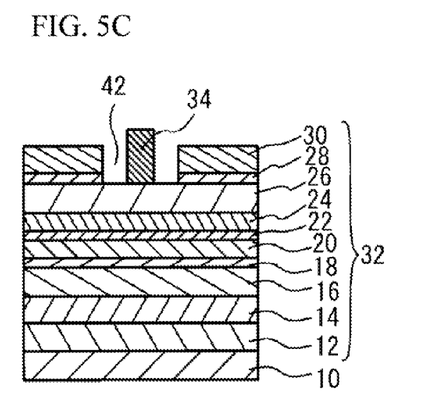
Figure 5D:
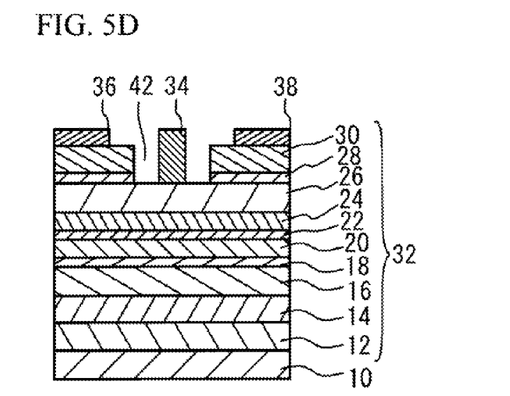

As illustrated in FIG. 5C, the gate electrode 34 is formed on the undoped AlGaAs layer 26 in the recess 42. The gate electrode 34 contains a Wsi film, a Ti film, and an Au film stacked from a side of the semiconductor layer 32, for example. As illustrated in FIG. 5D, the source electrode 36 and the drain electrode 38 are formed on the n-type GaAs layer 30 so as to sandwich the gate electrode 34. The source electrode 36 and the drain electrode 38 contain the AuGe film, the Ni film, and the Au film stacked from the semiconductor layer 32. Then, the heat treatment for about 3 minutes is performed at 450 degrees. Thereby, Au, Ge and Si are alloyed with GaAs. The semiconductor device of FIG. 1 is completed according to the above processes.

According to the first embodiment, the semiconductor device includes: an operation layer (e.g. the undoped InGaAs layer 20) that is made of a GaAs-based semiconductor and is formed on the substrate 10; a first AlGaAs layer (e.g. the n-type AlGaAs layer 24 and the undoped AlGaAs layer 26) formed on the operation layer; a second AlGaAs layer (e.g. the n-type AlGaAs layer 28) formed on the first AlGaAs layer; and the n-type GaAs layer 30 selectively formed on the second AlGaAs layer. The second AlGaAs layer selectively provided on the first AlGaAs layer corresponding to regions sandwiching the gate electrode can restrain the diffusion of Au from the source electrode 36 and the drain electrode 38, which contain Au and are formed on the n-type GaAs layer 30, to the first AlGaAs layer. In addition, the gate electrode 34 is formed on the first AlGaAs layer corresponding to a region where the second AlGaAs layer has been removed. Thereby, it is possible to restrain Au from being diffused into a semiconductor layer under the gate electrode 34, and increase of the on-resistance Ron can be restrained.

Second Embodiment

Figure 6A:
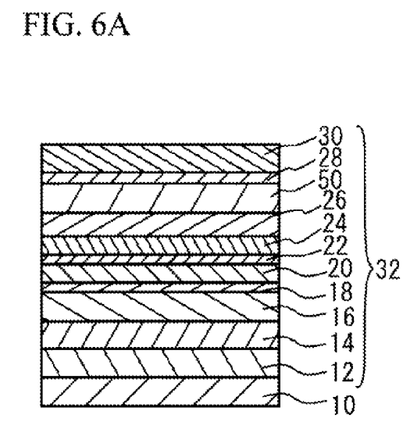
FIGS. 6A to 6D are cross-sectional diagrams illustrating a method for manufacturing the semiconductor device according to a second embodiment.
Figure 6B:
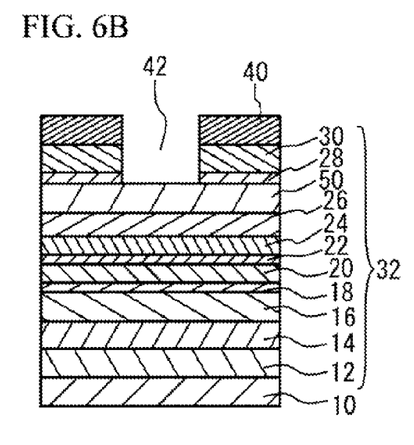
Figure 6C:
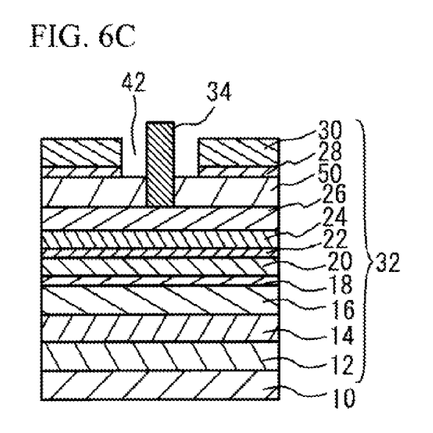
Figure 6D:
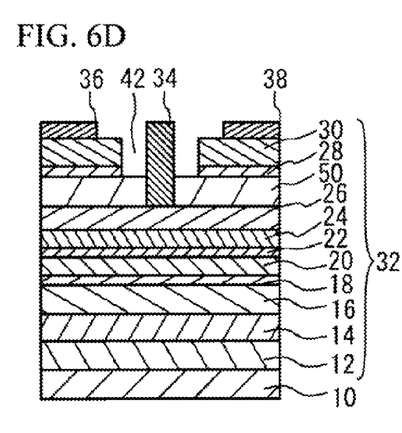

FIGS. 6A to 6D are cross-sectional diagrams illustrating a method for manufacturing the semiconductor device according to a second embodiment. As illustrated in FIG. 6A, a n-type GaAs layer 50 is formed on the undoped AlGaAs layer 26. The gate electrode 34 is formed so as to be embedded in the n-type GaAs layer 50. The n-type GaAs layer 50 acts as a Gate embedding layer. Therefore, the influence of a surface depletion layer can be restrained. Thereby, a current can flow between the source and the drain, compared with the first embodiment. The gate embedding layer shall not restrict to n-type GaAs layer 50. An un-doped (unintentionally doped) GaAs layer may substitute for the n-type GaAs layer 50. The n-type AlGaAs layer 28 is formed on the n-type GaAs layer 50. Since other compositions and the manufacturing method are the same as those of FIG. 5A of the first embodiment, a description thereof is omitted. As illustrated in FIG. 6B, the n-type GaAs layer 30 and the n-type AlGaAs layer 28 are removed by masking them by the photoresist 40. Since other compositions and the manufacturing method are the same as those of FIG. 5B of the first embodiment, a description thereof is omitted. As illustrated in FIG. 6C, an opening (i.e., a recess) is formed so as to penetrate the n-type GaAs layer 50. The gate electrode 34 is formed so as to be embedded in the opening formed in the n-type GaAs layer 50. The gate electrode 34 is formed so as to contact the undoped AlGaAs layer 26. Since other compositions and the manufacturing method are the same as those of FIG. 5C of the first embodiment, a description thereof is omitted. As illustrated in FIG. 6D, the source electrode 36 and the drain electrode 38 are formed on the n-type GaAs layer 30. Since other compositions and the manufacturing method are the same as those of FIG. 5D of the first embodiment, a description thereof is omitted.

As illustrated in the first embodiment, the second AlGaAs layer may foe directly provided on the first AlGaAs layer. As illustrated in the second embodiment, a GaAs layer with a recess may be provided between the first AlGaAs layer and the second AlGaAs, and the gate electrode 34 may be provided in the recess. Another semiconductor layer way be formed between the first AlGaAs layer and the second AlGaAs layer.

Although in the first and the second embodiments, the InGaAs layer is explained as the GaAs-based semiconductor layer used for the operation layer, the InGaAs layer may be a semiconductor layer such as a GaAs layer. The GaAs-based semiconductor is a semiconductor containing GaAs, and is GaAs, InGaAs, AlInAs, and AlInGa, for example. Although the n-type AlGaAs layer 24 and the undoped AlGaAs layer 26 are explained as the first AlGaAs layer, the first AlGaAs layer may be only the n-type AlGaAs layer, or only the undoped AlGaAs layer. Although an example in which Au, Ge and Ni are contained in the source electrode 36 and the drain electrode 38 is explained, Au may be contained in the source electrode 36 and the drain electrode 38. When Au is contained in the source electrode 36 and the drain electrode 38, the diffusion of Au can be restrained by the second AlGaAs layer. Although an example in which the source electrode 36 and the drain electrode 38 are formed using the AuGe layer, the Ni layer, and the Au layer is explained, the source electrode 36 and the drain electrode 38 may be formed using another layer.

Although the embodiments of the present invention is described in detail, the present invention is not limited to the specifically described embodiments and variations but other embodiments and variations may be made without departing from the scope of the claimed invention.

What is claimed is:

1. A semiconductor device comprising:
   an operation layer that is provided on a substrate and is made of a GaAs-based semiconductor;
   a first AlGaAs layer provided on the operation layer;
   a gate electrode provided on the first AlGaAs layer;
   an second AlGaAs layer having n-type conductivity and provided on the first AlGaAs layer of both sides of the gate electrode, an Al composition ratio of the second AlGaAs layer being larger than that of the first AlGaAs layer and being more than 0.3 and equal to or less than 0.5;
   an n-type GaAs layer selectively provided on the second AlGaAs layer; and
   a source electrode and a drain electrode that contain Au and are provided on the n-type GaAs layer, wherein;
   the second AlGaAs layer directly contacts with the first AlGaAs layer;
   the n-type GaAs layer directly contacts with the second AlGaAs layer; and
   the gate electrode directly contacts with the first AlGaAs layer.

2. The semiconductor device according to claim 1, wherein the thickness of the second AlGaAs layer is equal to or more than 5 nm and equal to or less than 7.5 nm.

3. The semiconductor device according to claim 1, wherein the GaAs-based semiconductor is any one of GaAs, InGaAs, AlInAs, AlInGaAs.

4. The semiconductor device according to claim 1, wherein a concentration of n-type impurity in the n-type second AlGaAs layer is equal to or more than $2\times10^{17}$ cm$^{-3}$.

5. The semiconductor device according to claim 1, wherein an Al composition ratio of the first AlGaAs layer
   is equal to or more than 0.2 and equal to or less than 0.3.

6. The semiconductor device according to claim 1, wherein the Al composition ratio of the second AlGaAs layer is equal to or more than 0.35.

* * * * *